(12) United States Patent
Boerstler et al.

(10) Patent No.: US 8,381,143 B2
(45) Date of Patent: Feb. 19, 2013

(54) STRUCTURE FOR A DUTY CYCLE CORRECTION CIRCUIT

(75) Inventors: David W. Boerstler, Round Rock, TX (US); Eskinder Hailu, Sunnyvale, CA (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 13/014,828

(22) Filed: Jan. 27, 2011

(65) Prior Publication Data

US 2011/0126162 A1 May 26, 2011

Related U.S. Application Data

(62) Division of application No. 12/128,754, filed on May 29, 2008, now Pat. No. 7,913,199.

(51) Int. Cl.
*G06F 17/50* (2006.01)
(52) U.S. Cl. .................. 716/100; 716/105; 327/175
(58) Field of Classification Search .................. 716/100, 716/105; 327/175
See application file for complete search history.

(56) References Cited

U.S. PATENT DOCUMENTS

| | | | |
|---|---|---|---|
| 4,149,111 A | 4/1979 | Coates, Jr. | |
| 4,646,223 A | 2/1987 | Sekiguchi | |
| 4,719,404 A | 1/1988 | Ekstrand | |
| 4,970,497 A | 11/1990 | Broadwater et al. | |
| 5,514,946 A | 5/1996 | Lin et al. | |
| 5,517,542 A | 5/1996 | Huq | |
| 5,617,016 A | 4/1997 | Borghi et al. | |
| 5,757,218 A | 5/1998 | Blum | |
| 5,774,704 A | 6/1998 | Williams | |
| 5,838,181 A | 11/1998 | Hesterman | |
| 5,883,523 A | 3/1999 | Ferland et al. | |
| 5,942,947 A | 8/1999 | Bhagwan et al. | |
| 6,198,317 B1 | 3/2001 | Chow et al. | |
| 6,363,507 B1 | 3/2002 | Truebenbach et al. | |
| 6,421,754 B1 | 7/2002 | Kau et al. | |

(Continued)

FOREIGN PATENT DOCUMENTS

| | | |
|---|---|---|
| EP | 1146644 A2 | 10/2001 |
| EP | 1139569 B1 | 12/2004 |

(Continued)

OTHER PUBLICATIONS

Notice of Allowance mailed Sep. 28, 2011 for U.S. Appl. No. 12/130,040; 5 pages.

(Continued)

*Primary Examiner* — Naum Levin
(74) *Attorney, Agent, or Firm* — Stephen J. Walder, Jr.; Matthew B. Talpis

(57) ABSTRACT

A design structure for a Duty Cycle Correction (DCC) circuit is provide in which pairs of field effect transistors (FETs) in known DCC circuit topologies are replaced with linear resistors coupled to switches of the DCC circuit such that when the switch is open, the input signal is routed through the linear resistors. The linear resistors are more tolerant of process, voltage and temperature (PVT) fluctuations than FETs and thus, the resulting DCC circuit provides a relatively smaller change in DCC correction range with PVT fluctuations than the known DCC circuit topology that employs FETs. The linear resistors may be provided in parallel with the switches and in series with a pair of FETs having relatively large resistance values. The linear resistors provide resistance that pulls-up or pulls-down the pulse width of the input signal so as to provide correction to the duty cycle of the input signal.

20 Claims, 6 Drawing Sheets

U.S. PATENT DOCUMENTS

| | | | |
|---|---|---|---|
| 6,424,178 B1 | 7/2002 | Harrison | |
| 6,426,660 B1 | 7/2002 | Ho et al. | |
| 6,448,826 B1 | 9/2002 | Ooishi et al. | |
| 6,452,843 B1 | 9/2002 | Zheng et al. | |
| 6,466,071 B2 | 10/2002 | Kim et al. | |
| 6,501,313 B2 | 12/2002 | Boerstler et al. | |
| 6,509,766 B1 | 1/2003 | Pomichter et al. | |
| 6,518,809 B1 | 2/2003 | Kotra | |
| 6,535,986 B1 | 3/2003 | Rosno et al. | |
| 6,583,657 B1 | 6/2003 | Eckhardt et al. | |
| 6,600,352 B2 | 7/2003 | Miyamoto | |
| 6,680,637 B2 | 1/2004 | Seo | |
| 6,717,877 B2 | 4/2004 | Suzuki et al. | |
| 6,750,689 B2 | 6/2004 | Fletcher et al. | |
| 6,794,908 B2 | 9/2004 | Erstad | |
| 6,844,766 B2 | 1/2005 | Sun | |
| 6,850,044 B2 | 2/2005 | Hansen et al. | |
| 6,922,113 B2 | 7/2005 | Mizuno et al. | |
| 6,960,952 B2 | 11/2005 | Nguyen et al. | |
| 7,054,787 B2 | 5/2006 | Gauthier et al. | |
| 7,078,943 B2 | 7/2006 | Ho et al. | |
| 7,142,996 B2 | 11/2006 | Patel et al. | |
| 7,181,658 B2 | 2/2007 | Ito | |
| 7,225,092 B2 | 5/2007 | Boerstler et al. | |
| 7,233,186 B2 | 6/2007 | Ishimi | |
| 7,322,001 B2 | 1/2008 | Boerstler et al. | |
| 7,330,081 B1 | 2/2008 | Asa et al. | |
| 7,360,135 B2 | 4/2008 | Boerstler et al. | |
| 7,392,413 B2 | 6/2008 | Shikata | |
| 7,417,480 B2 | 8/2008 | Boerstler et al. | |
| 7,675,338 B2 | 3/2010 | Boerstler et al. | |
| 7,716,516 B2 | 5/2010 | Muraki et al. | |
| 2002/0075048 A1 | 6/2002 | Miyamoto | |
| 2002/0140478 A1 | 10/2002 | Fletcher et al. | |
| 2002/0196059 A1* | 12/2002 | Garrett et al. | 327/108 |
| 2003/0112046 A1 | 6/2003 | Atallah et al. | |
| 2003/0126475 A1 | 7/2003 | Bodas | |
| 2003/0184363 A1 | 10/2003 | Lopata et al. | |
| 2004/0051509 A1 | 3/2004 | Matsuo et al. | |
| 2004/0075462 A1 | 4/2004 | Kizer et al. | |
| 2004/0108878 A1 | 6/2004 | Dosho et al. | |
| 2004/0145242 A1 | 7/2004 | Rodriguez et al. | |
| 2004/0145407 A1 | 7/2004 | Shirasawa et al. | |
| 2004/0177334 A1 | 9/2004 | Horan et al. | |
| 2004/0189364 A1 | 9/2004 | Lee et al. | |
| 2004/0201402 A1 | 10/2004 | Rajan et al. | |
| 2004/0232967 A1 | 11/2004 | Ishimi | |
| 2005/0007168 A1 | 1/2005 | Park et al. | |
| 2005/0043909 A1 | 2/2005 | Poirier et al. | |
| 2005/0107967 A1 | 5/2005 | Patel et al. | |
| 2005/0127958 A1 | 6/2005 | Ho et al. | |
| 2006/0103367 A1 | 5/2006 | Boerstler et al. | |
| 2007/0079197 A1 | 4/2007 | Boerstler et al. | |
| 2007/0300082 A1 | 12/2007 | Muraki et al. | |
| 2008/0012617 A1 | 1/2008 | Boerstler et al. | |
| 2008/0229270 A1 | 9/2008 | Boerstler et al. | |
| 2008/0246524 A1 | 10/2008 | Boerstler et al. | |
| 2009/0128206 A1 | 5/2009 | Boerstler et al. | |
| 2009/0132971 A1 | 5/2009 | Boerstler et al. | |
| 2010/0199237 A1 | 8/2010 | Kim et al. | |

FOREIGN PATENT DOCUMENTS

| | | | |
|---|---|---|---|
| JP | 10254425 A | 9/1998 | |
| JP | 2001167579 A | 6/2001 | |
| JP | 2001318730 A | 11/2001 | |
| JP | 2004348573 A | 12/2004 | |
| JP | 2005149476 A | 6/2005 | |

OTHER PUBLICATIONS

Response to Office Action filed with the USPTO on Aug. 10, 2011 for U.S. Appl. No. 12/130,040, 15 pages.
U.S. Appl. No. 11/457,637.
U.S. Appl. No. 11/942,983.
U.S. Appl. No. 12/128,754.
U.S. Appl. No. 12/130,040.
U.S. Appl. No. 12/140,335.
Office Action for corresponding Japanese Patent Application No. 2007-163089, dated Jul. 14, 2009, 4 pages.
Office Action for corresponding Japanese Patent Application No. 2007-163089, dated Nov. 10, 2009, 2 pages.
Office Action mailed Feb. 4, 2011 for U.S. Appl. No. 12/130,040, 13 pages.
Office Action mailed May 10, 2011 for U.S. Appl. No. 12/130,040; 8 pages.
Response to Office Action filed with the USPTO on May 4, 2011 for U.S. Appl. No. 12/130,040, 23 pages.

* cited by examiner

STRUCTURE FOR A DUTY CYCLE CORRECTION CIRCUIT

This application is a divisional of application Ser. No. 12/128,754, filed May 29, 2008, status allowed.

BACKGROUND OF THE INVENTION

1. Field of the Invention

The present application relates generally to a design structure and more specifically, to a design structure for a duty cycle correction circuit whose operation is largely independent of operating voltage and process.

2. Background of the Invention

Many modern electronic systems require a precise clock circuit for proper operation. For example, digital information processing equipment such as a computer must have an accurate and reliable clock source to control the various signals that are sent between the functional components of the computer. In such systems, it is very important that all of the components are properly synchronized to a common clock.

Synchronous electronic equipment utilizes an oscillator circuit to produce a basic source frequency signal. This signal is in turn utilized to drive other circuitry (such as a phase-lock loop, or PLL) for developing desired rise and fall times of square-wave signals, and desired signal levels. The clock rate requirements for timing digital information processing systems are generally proportional to the switching speeds of the circuitry employed. As clock circuits improve and clock rates increase, tolerances are necessarily diminished, and clock skew becomes an ever-increasing problem.

Different problems can arise in the accuracy of the clock signal. Variations in timing between successive rising edges (or falling edges), i.e., the overall cycle variation (often referred to as "jitter") typically relates to the oscillator. Variations in the duty cycle (the portion of the overall cycle in which the signal is "on"), i.e., between a rising edge and the next falling edge, typically relate to the clock distribution network, although variations in the duty cycle can also be caused by the oscillator. Clock distribution networks use various elements such as buffers and inverters, often cascaded. These networks can introduce duty cycle distortion due to circuit and interconnect modeling inaccuracies, process variations, and the environment.

For systems which use both the rising and falling edges for timing, a non-optimal clock duty cycle may require a lower clock frequency, reducing performance. A duty cycle error of just 5% for instance (from 50% to 45%) may require a system clock to run at a maximum speed that is 10% lower, causing a significant impact on system performance.

Many circuits require a specific duty cycle for clocking signals to provide optimal performance. For example, multiphase clocking systems often require a symmetrical wave shape that is characteristically desired to operate at a 50% duty cycle. Some applications require a duty cycle other than 50%. One use of non-50% duty cycles is in digital clocking where pulse-mode latching is used rather than edge-latching in order to reduce the setup-hold overhead associated with the latches.

Actual duty cycles typically do not have precisely the desired value. Even if a clock signal has the required duty cycle at some point in the system (e.g., at the output of an on-chip voltage-controlled oscillator), the duty cycle will deviate from the required percentage as the clock signal is buffered and distributed throughout the chip.

Different approaches have been devised to actively control the duty cycle. Most of these approaches involve measurement of the error in the duty cycle, and provision of a correction signal to reduce that error. The generation of the correction signal is performed by a duty cycle correction circuit. Various types of duty cycle correction circuits have been devised. One such duty cycle correction circuit is shown in FIG. 1A.

As shown in FIG. 1A, the duty cycle correction circuit 100 is comprised of a plurality of pairs of P-type and N-type field effect transistors (FETs). The first pair of FETs comprises a first P-type FET (PFET) 110 and a first N-type FET (NFET) 120. The FETs of the first pair of FETs have relatively large resistance values compared to the FETs in the second pair of FETs. A second pair of FETs comprises a second P-type FET (PFET) 130 and a second N-type FET (NFET) 140. The FETs of the second pair of FETs have a relatively small resistance value when compared to the FETs of the first or third pair of FETs. By the term "small" in the present description what is meant is that the smaller item is less than approximately 10% of the larger item. Thus, for example, the resistance value of the second pair of FETs is less than approximately 10% of the resistance values of the first or third pair of FETs.

The first and second pairs of FETs are coupled to a third pair of FETs that comprises a third PFET 150 and a third NFET 160. The first pair of FETs are part of the inverter circuit that provides the duty cycle correction. The second pair of FETs are used to increase or decrease the pulse width of the input signal. The third pair of FETs operate as buffers between each successive duty cycle correction stage.

The second pair of FETs are used to selectively pull-up or pull-down the pulse width of the input signal IN, e.g., an input clock signal. The selective pull-up and pull-down operation of the duty cycle correction circuit 100 is made possible by the controlled opening and closing of switches 170 and 180. The opening and closing of switches 170 and 180 may be controlled by a duty cycle control unit 190 based on a detected duty cycle as detected by duty cycle detection unit 195, for example. An example of such a duty cycle control unit 190 and detection unit 195 is provided in U.S. Pat. No. 6,501,313.

As shown in FIG. 1A, the pull-up of the pulse width, i.e. the increase of the pulse width and thus, the decrease in the duty cycle, is affected by the selective closing of switch 170. As shown in FIG. 1B, the duty cycle correction due to the closing of switch 170 is equivalent to the driving of the input signal toward a capacitance of the node Out' through parallel resistors. The parallel resistors have resistance values equivalent to the on-resistances of the PFET 110 and PFET 130.

Similarly, the pull-down of the pulse width, i.e. the decrease in the pulse width and thus, the increase in the duty cycle, is affected by the selective closing of switch 180. As shown in FIG. 1C, the duty cycle correction due to the closing of switch 180 is equivalent to the driving of the input signal away from a capacitance of the node Out' through parallel resistors. The parallel resistors have resistance values equivalent to the on-resistances of the NFET 120 and NFET 140.

With the circuitry of FIG. 1A, if no duty cycle correction is required, as determined by the duty cycle detection unit 195, for example, then the switches 170 and 180 are open, i.e. the duty cycle control unit 190 does not assert control signals to the switches 170 and 180. In that case, assuming that the strengths of the first PFET 110 and the first NFET 120 are identical, the rise/fall time constant ($T_{rise/fall}$) to charge the node Out' to a voltage equal to e*VDD will be:

$$T_{rise/fall} = CR_{P1,N1} \qquad (1)$$

where C is the effective capacitance at node Out' and $R_{P1,N1}$ are the effective on-resistances of PFET 110 and NFET 120.

To decrease the pulse width, and thereby increase the duty cycle, the switch 170 is closed and, as a result the time constant for charging the node Out' to a voltage equal to e*VDD is approximately the product of the effective capacitance at node Out' and the parallel combination of resistances of NFET 120 and NFET 140:

$$T_{rise} \sim C(R_{N1} // R_{N2}) \quad (2)$$

A first order approximation of the incremental duty cycle correction of the duty cycle correction circuit 100 may be found by subtracting equation 2 from equation 1:

$$\text{Correction} \sim C[R_{N1} - (R_{N1} // R_{N2})] \text{ or}$$

$$\text{Correction} \sim C[R_{N1}^2/(R_{N1} + R_{N2})] \quad (3)$$

For an increase in pulse width, the incremental correction is given by $$\text{Correction} \sim C[R_{P1}^2/(R_{P1} + R_{P2})] \quad (4)$$

In order to provide more granularity with regard to the correction performed using the mechanism of FIG. 1A, a series of pairs of FETs 130 and 140, as well as switches 170 and 180, may be provided that are individually controllable to provide various levels of duty cycle correction. FIG. 2A shows such a circuit arrangement in which a plurality of pairs of FETs 210-240 and switches 250-280 are provided in series. The switches 250-280 may be individually controlled by the duty cycle control unit 290 which has logic for determining a set of control signals for applying a desired duty cycle correction based on the measured duty cycle from the duty cycle detection unit 295 and a desired duty cycle, e.g., a 50% duty cycle.

FIGS. 2B and 2C illustrate the pull-up and pull-down behavior of the series of pairs of FETs 210-240 with regard to the duty cycle correction, similar to FIGS. 1B and 1C. As shown in FIGS. 2B and 2C, the affect is basically to add additional resistances in parallel between the capacitance of node Out' and input signal source.

For a series of n duty cycle correction chains, i.e. pairs of correction FETs 210-240, as shown in FIG. 2A, equations 3 and 4 above may be modified to be the following:

$$\text{Correction} = C[R_{N1}^2(3_{i\,1}R_{Ni})]/[(R_{N1})(3_{i\,1}R_{Ni}) + (R_{N2})(3_{i\,2}R_{Ni}) + \ldots + (R_{Nn})(3_{i\,n}R_{Ni})] \quad (5)$$

$$\text{Correction} = C[R_{P1}^2(3_{i\,1}R_{Pi})]/[(R_{P1})(3_{i\,1}R_{Pi}) + (R_{P2})(3_{i\,2}R_{Pi}) + \ldots + (R_{Pn})(3_{i\,n}R_{Pi})] \quad (6)$$

Again, it should be noted that the resistors $R_{N/P}$ are the on-resistances of the FETs in the pairs of FETs 210-240.

In the above arrangements, the resistance values of the FETs are strongly dependent upon process (i.e., manufacturing tolerance due to errors in the manufacturing process), voltage and temperature (PVT). The sensitivity to voltage and temperature is a result of various FET parameters that show strong dependence on voltage and temperature. The sensitivity to process is due to the many parameters that are involved in the formation of FETs, including doping parameters, gate oxide parameters, silicide parameters, and the like, which may all have errors tolerances associated with them.

The capacitance value C of the node Out' is generally considered to have weak dependence on temperature and voltage, but has more dependence on process variations for similar reasons as set forth above with regard to the FETs. However, this dependence on process variation is still smaller than that of the FET on-resistances.

Referring again to equations 5 and 6 above, it is apparent that the variability due to PVT in the second term of these equations does not cancel out. This is because the numerator of the second term is squared while the denominator consists of linear sums. Thus, the duty cycle correction varies substantially with process, voltage and temperature in the circuitry arrangements illustrated above in FIGS. 1A and 2A.

While a duty cycle correction (DCC) circuit using the topology arrangement shown in FIG. 1A or FIG. 2A may display excellent granularity and linearity, it also displays very strong undesirable dependence on process and operating voltage conditions. For example, FIGS. 3A and 3B provide exemplary plots illustrating variances in duty cycle correction range, i.e. the maximum possible duty cycle correction possible with the circuit, due to changes in operating voltage and process for the DCC circuit topologies illustrated in FIGS. 1A and 2A. In the depicted examples, the duty cycle correction is provided in terms of pico seconds (ps) such that, for example, if an original pulse width is 100 ps, then the pulse may be expanded to 105 ps or reduced to 95 ps with a 5 ps duty cycle correction.

As shown in FIGS. 3A and 3B, between 0.8V and 1.2V operating voltage, there is approximately a 40% change in DCC correction range. Moreover, between a process parameter value (nm) of 0.03 (i.e. a fastest manufacturing process) and a process parameter value (nm) of 0.95 (slowest manufacturing process), there is approximately an 85% change in DCC correction range. Thus, there is a large variance in DCC correction range based on operating voltage and manufacturing process, which illustrates the dependence of DCC correction on the particular operating voltage and manufacturing process used with a particular circuit.

BRIEF SUMMARY OF THE INVENTION

In view of the above, it would be beneficial to have a duty cycle correction (DCC) circuit that is less dependent upon process and operating voltage. The illustrative embodiments provide such a DCC circuit by replacing the pairs of field effect transistors (FETs) in the known DCC circuit topology with linear resistors coupled to the switches of the DCC circuit such that when the switch is open, the input signal is routed through the linear resistors. The linear resistors are more tolerant of process, voltage and temperature (PVT) fluctuations than FETs and thus, the resulting DCC circuit provides a relatively smaller change in DCC correction range with PVT fluctuations than the known DCC circuit topology that employs FETs.

The linear resistors may be provided in parallel with the switches and in series with a pair of FETs having relatively large resistance values. The linear resistors provide resistance that pulls-up or pulls-down the pulse width of the input signal so as to provide correction to the duty cycle of the input signal. The correction afforded is approximately the product of the capacitance of the output node and the resistance of the linear resistor. For a string of n duty cycle correction chains, the correction is approximately the sum of the resistances of the linear resistors multiplied by the capacitance of the output node. Since the node capacitance and the linear resistors are independent of the operating voltage, the duty cycle correction will also be, to first order, independent of operating voltage. Furthermore, the linear resistors can be made to have very tightly controlled manufacturing process compared to FETs and thus, are largely independent of the process.

Because the resulting DCC circuit of the illustrative embodiments is less sensitive to PVT fluctuations, the DCC circuit of the illustrative embodiments is well suited for applications where non-50% duty cycle and even varying duty cycle is desirable. Known DCC circuits are concerned with achieving a fixed duty cycle value for all conditions, e.g., 50% duty cycle. Having a fixed duty cycle may not necessarily result in optimal operating conditions in all applications. For example, for optimal performance at a lowered voltage, memory arrays of an integrated circuit device may need a non-50% or even varying duty cycle. Since the illustrative embodiments provide a DCC circuit that is largely independent of process and voltage fluctuations, the DCC circuit of the illustrative embodiments may be used to provide such non-50% duty cycles and/or varying duty cycles.

In one illustrative embodiment, a duty cycle correction apparatus is provided that comprises a first pair of field effect transistors (FETs) having a first P-type FET and a first N-type FET, and at least two linear resistors coupled to the first pair of FETs. A first linear resistor may be coupled to the first P-type FET and a second linear resistor may be coupled to the first N-type FET. The apparatus may further comprise a first switch coupled to the first linear resistor and a second switch coupled to the second linear resistor. An input signal may be provided to the first pair of FETs and a corrected input signal may be output by the at least two linear resistors. The first and second switches may be selectively controlled so as to cause at least one of the first or second linear resistors to increase or decrease a duty cycle of the input signal.

The first linear resistor may be coupled in series to the first P-type FET and the second linear resistor may be coupled in series to the first N-type FET. The first switch may be coupled to the first linear resistor in parallel and the second switch may be coupled to the second linear resistor in parallel.

A resistance value associated with the first linear resistor may be less than approximately ten percent of a resistance value associated with the first P-type FET. A resistance value associated with the second linear resistor may be less than approximately ten percent of a resistance value associated with the first N-type FET.

The duty cycle correction apparatus may further comprise a duty cycle detection unit coupled to an input signal line of the duty cycle correction apparatus and a duty cycle control unit coupled to the duty cycle detection unit and the first and second switches. The duty cycle detection unit may provide a measure of a duty cycle of the input signal to the duty cycle control unit. The duty cycle control unit may control opening and closing of the first and second switches, so as to provide an appropriate amount of duty cycle correction, based on the measure of the duty cycle of the input signal provided by the duty cycle detection unit and a desired duty cycle for the input signal.

The first linear resistor may operate on a signal output by the first P-type FET to thereby pull-up a pulse width of the signal output by the first P-type FET and thereby decrease a duty cycle of the signal output by the P-type FET. The second linear resistor may operate on a signal output by the first N-type FET to thereby pull-down a pulse width of the signal output by the first P-type FET and thereby increase a duty cycle of the signal output by the N-type FET.

If no duty cycle correction is required, both the first switch and the second switch may be closed. If a duty cycle of the input signal is to be decreased, the first switch may be opened and the second switch may be closed, such that the input signal passes through the first linear resistor. If a duty cycle of the input signal is to be increased, the first switch may be closed and the second switch may be opened, such that the input signal passes through the second linear resistor.

The duty cycle correction apparatus may further comprise a second pair of FETs coupled to the first and second linear resistors. The second pair of FETs may comprise a second P-type FET and a second N-type FET. The second pair of FETs may operate as buffers between successive duty cycle correction stages.

The duty cycle correction apparatus may further comprise one or more additional first linear resistors coupled in series with the first linear resistor, one or more additional second linear resistors coupled in series with the second linear resistor, and one or more additional switches coupled to the one or more additional first and second linear resistors.

The duty cycle correction apparatus may further comprise a duty cycle detection unit coupled to an input signal line of the duty cycle correction apparatus and a duty cycle control unit coupled to the duty cycle detection unit, the first and second switches, and the one or more additional switches. The duty cycle detection unit may provide a measure of a duty cycle of the input signal to the duty cycle control unit and the duty cycle control unit may control opening and closing of the first, second, and one or more additional switches, so as to provide an appropriate amount of duty cycle correction, based on the measure of the duty cycle of the input signal provided by the duty cycle detection unit and a desired duty cycle for the input signal.

In a further illustrative embodiment, a method of providing a duty cycle correction circuit is provided. The method may comprise, for example, providing a first pair of field effect transistors (FETs) having a first P-type FET and a first N-type FET, and providing at least two linear resistors coupled to the first pair of FETs. The first linear resistor may be coupled to the first P-type FET and a second linear resistor may be coupled to the first N-type FET. The method may further comprise providing a first switch coupled to the first linear resistor and providing a second switch coupled to the second linear resistor. An input signal may be provided to the first pair of FETs and a corrected input signal may be output by the at least two linear resistors. The first and second switches may be selectively controlled so as to cause at least one of the first or second linear resistors to increase or decrease a duty cycle of the input signal.

The first linear resistor may be provided coupled in series to the first P-type FET and the second linear resistor may be provided coupled in series to the first N-type FET. The first switch may be provided coupled to the first linear resistor in parallel and the second switch may be provided coupled to the second linear resistor in parallel.

A resistance value associated with the first linear resistor may be less than approximately ten percent of a resistance value associated with the first P-type FET. A resistance value associated with the second linear resistor may be less than approximately ten percent of a resistance value associated with the first N-type FET.

The method may further comprise providing a duty cycle detection unit coupled to an input signal line of the duty cycle correction apparatus and providing a duty cycle control unit coupled to the duty cycle detection unit and the first and second switches. The duty cycle detection unit may provide a measure of a duty cycle of the input signal to the duty cycle control unit. The duty cycle control unit may control opening and closing of the first and second switches, so as to provide an appropriate amount of duty cycle correction, based on the measure of the duty cycle of the input signal provided by the duty cycle detection unit and a desired duty cycle for the input signal.

The first linear resistor may operate on a signal output by the first P-type FET to thereby pull-up a pulse width of the signal output by the first P-type FET and thereby decrease a duty cycle of the signal output by the P-type FET. The second linear resistor may operate on a signal output by the first N-type FET to thereby pull-down a pulse width of the signal output by the first P-type FET and thereby increase a duty cycle of the signal output by the N-type FET.

If no duty cycle correction is required, both the first switch and the second switch may be closed. If a duty cycle of the input signal is to be decreased, the first switch may be opened and the second switch may be closed, such that the input signal passes through the first linear resistor. If a duty cycle of the input signal is to be increased, the first switch may be closed and the second switch may be opened, such that the input signal passes through the second linear resistor.

In yet another illustrative embodiment, a method of correcting a duty cycle of an input signal is provided. The method may comprise measuring a duty cycle of the input signal using a duty cycle detection unit and providing the measurement of the duty cycle to a duty cycle control unit. The method may further comprise comparing the measured duty cycle to a desired duty cycle and controlling opening and closing of switches associated with linear resistors in a duty cycle correction circuit based on results of the comparison of the measured duty cycle to the desired duty cycle. The method may further comprise applying duty cycle correction to the input signal via the duty cycle correction circuit based on the opening and closing of the switches. The opening and closing of switches in the duty cycle correction circuit may cause the input signal to either pass through or bypass the linear resistors of the duty cycle correction circuit which modify the duty cycle of the input signal.

In another illustrative embodiment, a design structure embodied in a machine readable medium for designing, manufacturing, or testing an integrated circuit is provided. The design structure may be encoded on a machine-readable data storage medium and may comprise elements that, when processed in a computer-aided design system, generates a machine-executable representation of a duty cycle correction circuit. The design structure may be a hardware description language (HDL) design structure. The design structure may comprise a netlist and may reside on a storage medium as a data format used for the exchange of layout data of integrated circuits.

In yet another illustrative embodiment, a method in a computer-aided design system for generating a functional design model of a duty cycle correction circuit is provided.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

The illustrative embodiments provide a duty cycle correction (DCC) circuit that utilizes linear resistors rather than FETs to provide the duty cycle correction. Since the linear resistors are less sensitive to operating voltage and process, the resulting DCC circuit is more tolerant of variations in operating voltage and process. One application of such a DCC circuit is to provide varying duty cycles and non-50% duty cycles to circuitry of a data processing device where such varying or non-50% duty cycles provide more optimal performance.

Figure 4A:
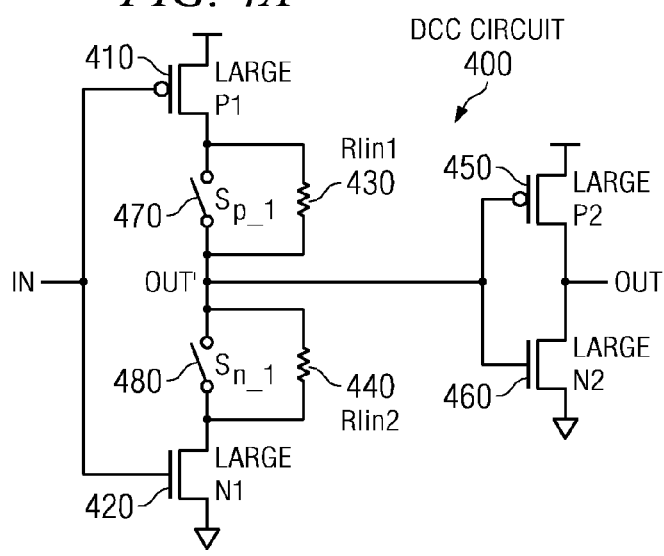
FIG. 4A is an exemplary diagram illustrating a duty cycle correction circuit in accordance with one illustrative embodiment.

FIG. 4A is an exemplary diagram illustrating a duty cycle correction (DCC) circuit in accordance with one illustrative embodiment. As shown in FIG. 4A, the DCC circuit 400 includes a first pair of FETs comprising a first PFET 410 and a first NFET 420. The first pair of FETs are part of the inverter circuit that provides the duty cycle correction. The first PFET 410 and NFET 420 preferably have large resistance values. Again, the terms "large" and "small" as they are used in the present description are meant to refer to a relationship in which the "small" item is less than approximately 10% of the "large" item.

The first pair of FETs 410 and 420 are in series with respective ones of linear resistors 430 and 440, and switches 470 and 480. The linear resistors 430 and 440 are provided in parallel with their respectively associated switches 470 and 480. That is, linear resistor 430 is parallel to switch 470 and linear resistor 440 is parallel to switch 480. The switches 470 and 480 are controlled to be open or closed by a duty cycle control unit (not shown) in a similar manner as described previously with regard to FIGS. 1A and 2A. The switches 470 and 480 are preferably complimentary metal oxide semiconductor (CMOS) switches that are designed to have approximately identical on-resistance values. These on-resistance values are preferably much smaller than those of the linear resistors 430 and 440, as well as FETs 410 and 420, and thus may be considered negligible.

Figure 1A:
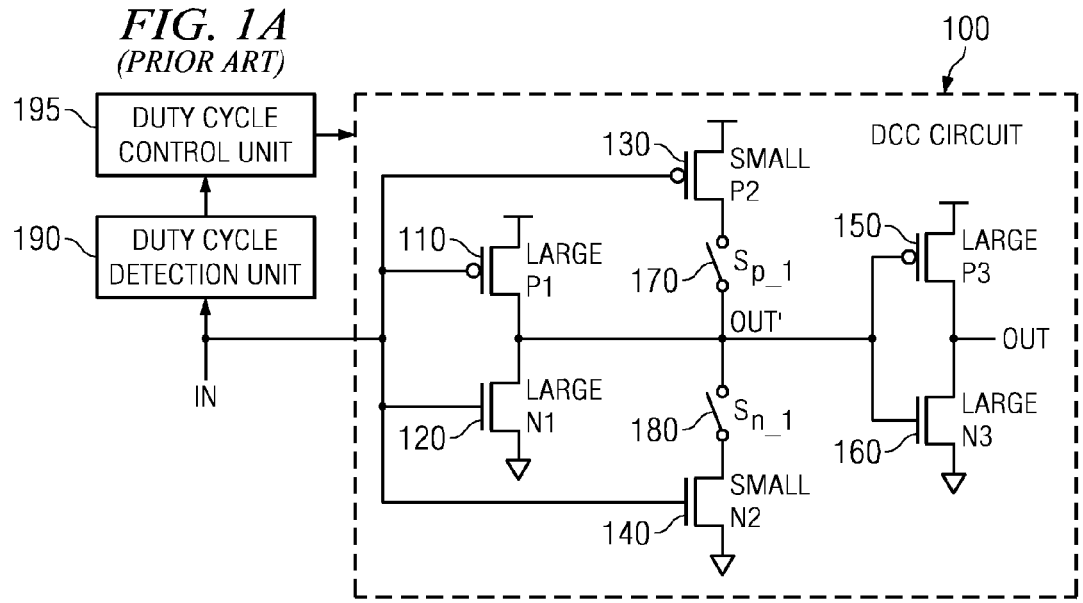
FIG. 1A is an exemplary diagram illustrating a known duty cycle correction circuit.
Figure 1B:
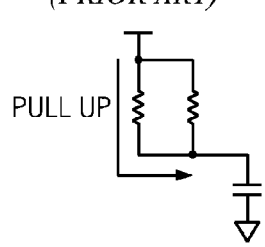
FIGS. 1B-1C are exemplary diagrams illustrating the effective pull-up and pull-down of a signal pulse width in accordance with the known duty cycle correction circuit of FIG. 1A.
Figure 1C:
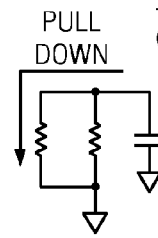
Figure 2A:
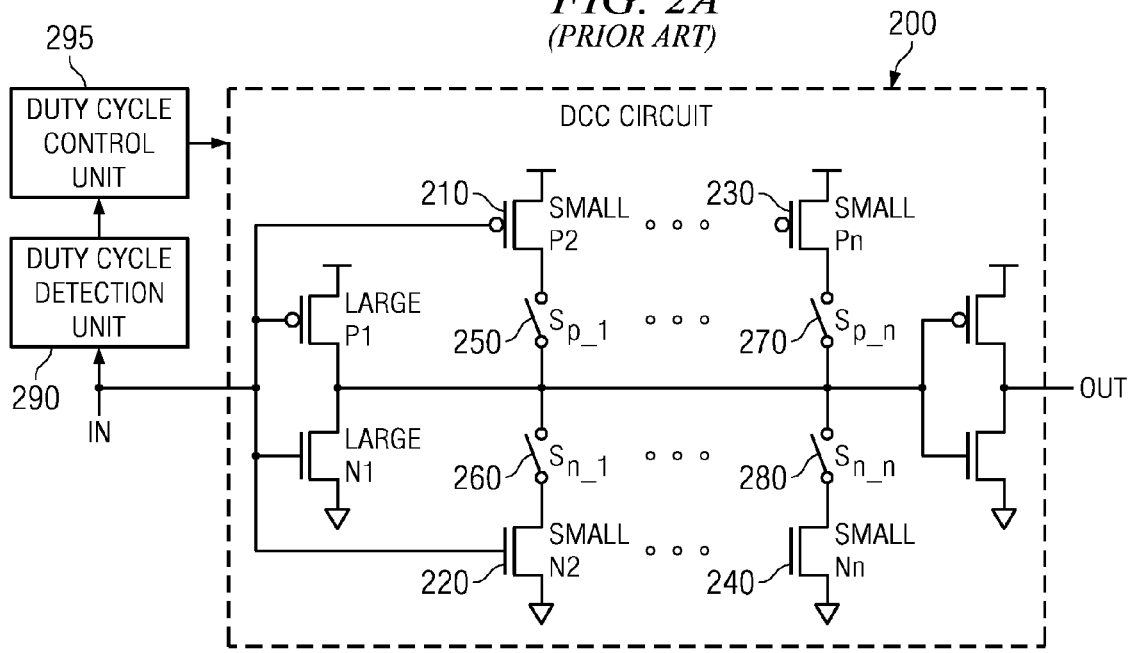
FIG. 2A is an exemplary diagram illustrating an expanded duty cycle correction circuit in accordance with a known mechanism.
Figure 2B:
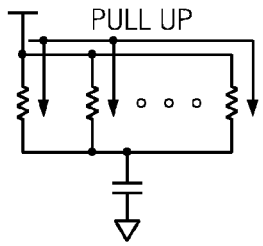
FIGS. 2B-2C are exemplary diagrams illustrating the effective pull-up and pull-down of a signal pulse width in accordance with the known duty cycle correction circuit of FIG. 2A.
Figure 2C:
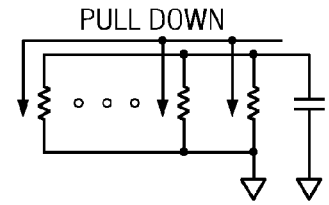
Figure 3A:
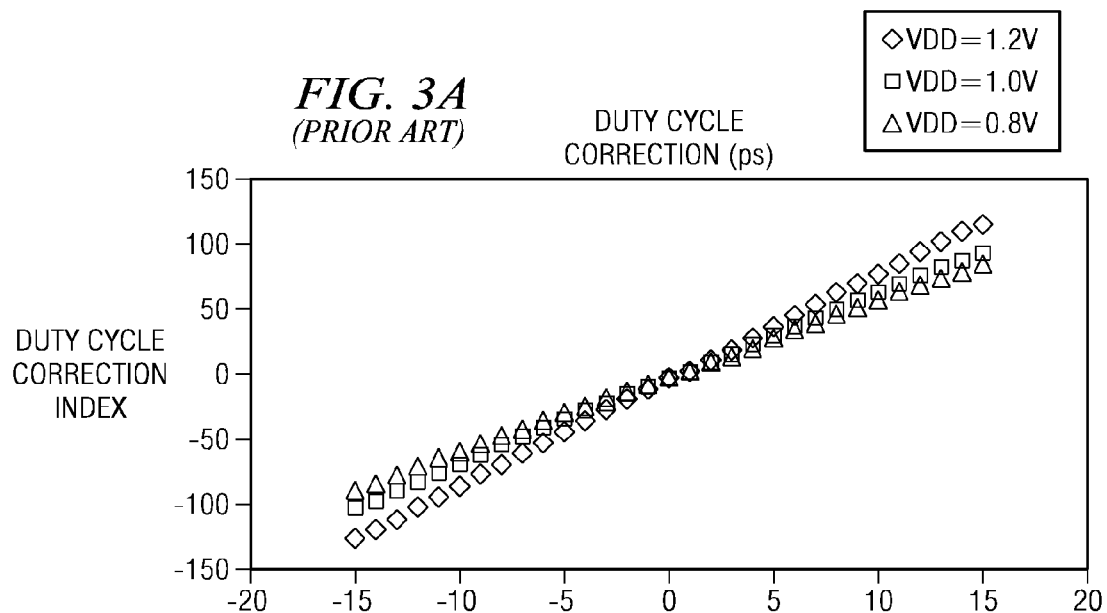
FIGS. 3A-3B are exemplary plots illustrating variances in duty cycle correction range due to changes in operating voltage and process for the DCC circuit topologies illustrated in FIGS. 1A and 2A.
Figure 3B:
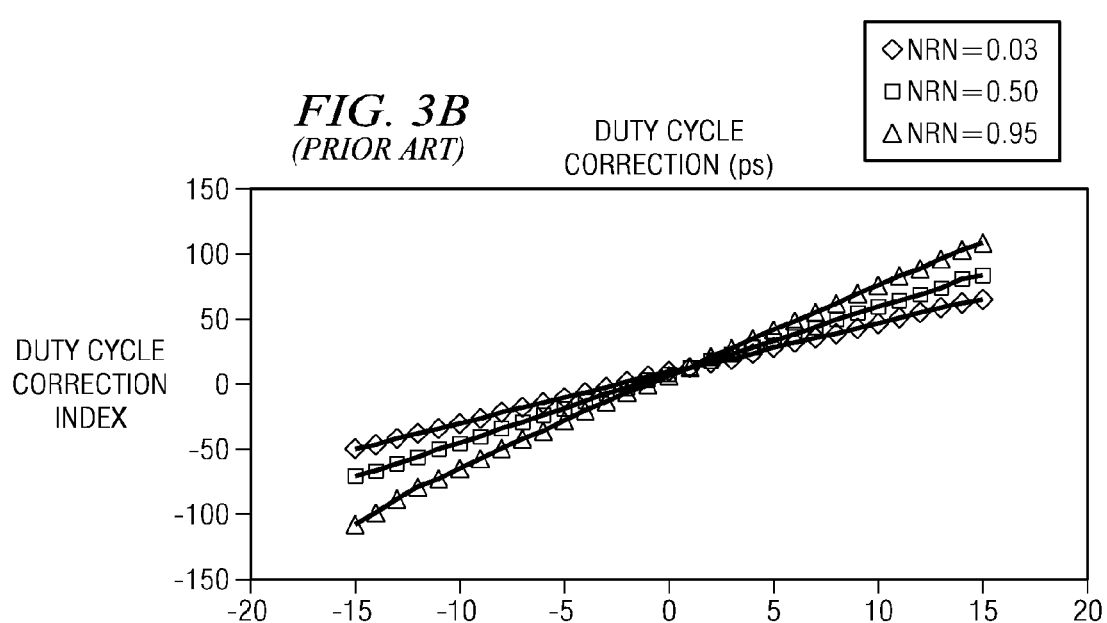

It should be noted that, when comparing FIG. 4A to FIG. 1A, the second pair of FETs 130 and 140 in FIG. 1A have been eliminated in the topology of FIG. 4A. The duty cycle correction afforded by the FETs 130 and 140 in FIG. 1A is provided by the linear resistors 430 and 440 in FIG. 4A. Thus, in the illustrative embodiments, the duty cycle correction is performed by linear resistors 430 and 440 which are much less sensitive to variances in operating voltage and process than the FETs 130 and 140 in the known DCC circuitry topology.

The DCC corrected output at the output node Out' is provided to a second pair of FETs 450 and 460 which again have relatively large resistance values. The second pair of FETs 450 and 460 operate as buffers between each successive duty cycle correction stage. The resulting output may then be provided to the downstream circuitry for use.

With the DCC circuit 400 of FIG. 4A, in operation, if no DCC correction is required, both switches 470 and 480 are closed. For node Out', the rise/fall time constant Trise/fall may be calculated as:

$$T_{rise/fall} \sim CR_{P1,N1} \quad (7)$$

where $R_{P1,N1}$ corresponds to the on-resistances of the PFET 410 and NFET 420, respectively, and C is the effective capacitance at node Out'.

To increase the pulse width (i.e. decrease the duty cycle), the switch 470 is opened and thus, the input signal is passed through the linear resistor 430. In such a case, the rise time constant is given by:

$$T_{rise} \sim C(R_{P1} + R_{lin1}) \quad (8)$$

where R lin 1 is the resistance value of the linear resistor associated with switch 470, i.e. the linear resistor 430.

The first order approximation of the incremental duty cycle correction is then found by subtracting equation (8) from equation (7) as follows:

$$\text{Correction} \sim C[(R_{P1} + R_{lin1}) - R_{P1}] \text{ or}$$

$$\text{Correction} \sim C[R_{lin1}] \quad (9)$$

In order to decrease the pulse width, i.e. increase the duty cycle, the switch 480 is opened, thereby causing the input signal to pass through the linear resistor 440. In such a case, the incremental correction is given by:

$$\text{Correction} \sim C[R_{lin1}'] \quad (10)$$

where $R_{lin1}'$ is the resistance value of the linear resistor 440 associated with the switch 480.

Figure 4B:
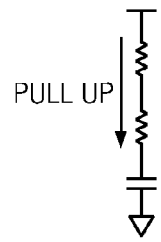
FIGS. 4B-4C are exemplary diagrams illustrating the effective pull-up and pull-down of a signal pulse width in accordance with the illustrative embodiment of FIG. 1A.
Figure 4C:
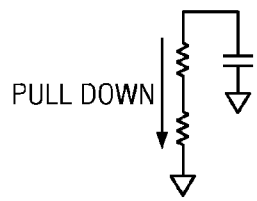

FIGS. 4B-4C are exemplary diagrams illustrating the effective pull-up and pull-down of a signal pulse width in accordance with the illustrative embodiment of FIG. 1A. As shown in FIG. 4B, when the switch 470 is opened, the pull-up of the input signal pulse width is essentially equivalent to passing the input signal through two resistors in series, corresponding to the first PFET 410 and the first linear resistor 430. As shown in FIG. 4C, when the switch 480 is opened, the pull-down of the input signal pulse width is essentially equivalent to passing the input signal through two resistors in series, corresponding to the first NFET 420 and the second linear resistor 440, away from a capacitor, i.e. node Out'.

As with the known DCC circuitry topology, additional granularity in the DCC correction may be provided by adding additional DCC correction elements to the circuit topology. However, with the illustrative embodiments, the addition of the DCC correction elements involves the addition of linear resistors, and their corresponding switches, in series with the existing switches and linear resistors of FIG. 4A.

Figure 5A:
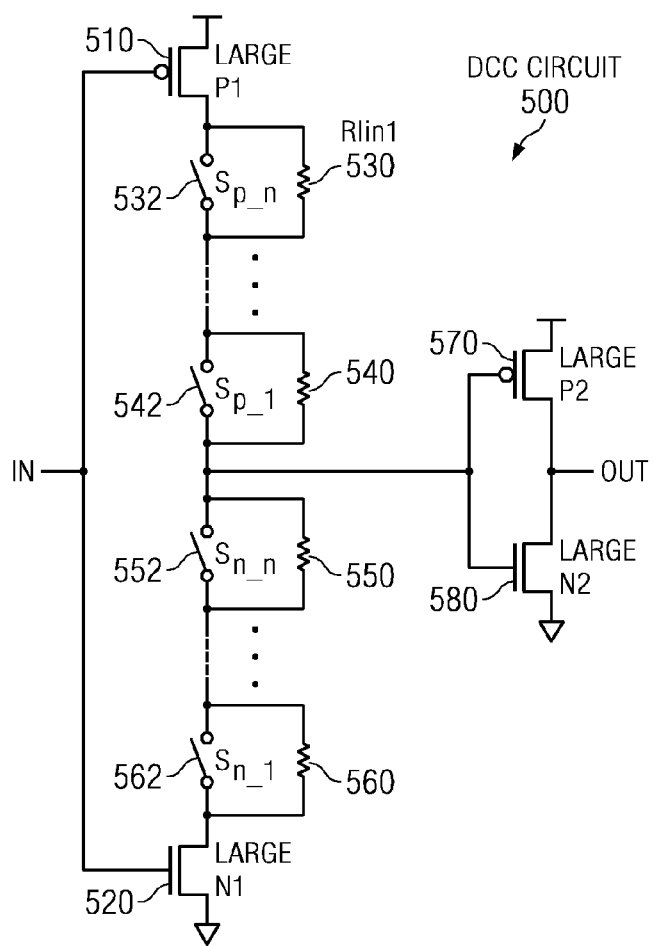
FIG. 5A is an exemplary diagram illustrating an expanded duty cycle correction circuit in accordance with one illustrative embodiment.

FIG. 5A is an exemplary diagram illustrating an expanded duty cycle correction circuit in accordance with one illustrative embodiment. As shown in FIG. 5A, the expanded duty cycle correction circuit includes the first and second pairs of FETs 510, 520, 570, and 580. In series with the first pair of FETs 510 and 520 are the first and second linear resistors 530 and 560, which may correspond to the first and second linear resistors 430 and 440 in FIG. 4A. Similarly, first and second CMOS switches 532 and 562 are provided in parallel with the first and second linear resistors 530 and 560, respectively, and in series with the first pair of FETs 510 and 520.

In addition to these elements, the DCC circuit 500 is expanded to include one or more additional linear resistors 540 and 550, and their corresponding switches 542 and 552, in series with the existing resistor/switch pairs. For example, a third linear resistor 540, and its corresponding parallel switch 542, is added in series with the first linear resistor 530 and its corresponding switch 532. Similarly, a fourth linear resistor 550, and its corresponding parallel switch 552, is added in series with the first linear resistor 560 and its corresponding switch 562. Additional linear resistors and switches may be added to the depicted topology in a similar manner without departing from the spirit and scope of the present invention.

Figure 5B:
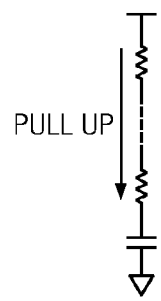
FIGS. 5B-5C are exemplary diagrams illustrating the effective pull-up and pull-down of a signal pulse width in accordance with the illustrative embodiment of FIG. 5A.
Figure 5C:
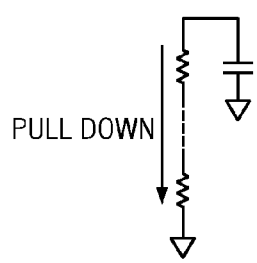

FIGS. 5B-5C are exemplary diagrams illustrating the effective pull-up and pull-down of a signal pulse width in accordance with the illustrative embodiment of FIG. 5A. As shown in FIGS. 5B and 5C, when compared to FIGS. 4B and 4C, the difference in effective pull-up and pull-down of the signal pulse width is the additional resistances provided in series with the existing resistances. Thus, the pull-up and pull-down operations are equivalent to passing the input signal through a series of n resistors either toward or away from a capacitance associated with the output node Out'.

With the arrangement of FIG. 5A, a string of duty cycle correction elements, i.e. pairs of linear resistors 530, 540, 550, 560 and switches 532, 542, 552, and 562, are provided which may be individually controlled to provide a desired granularity of DCC correction. With such a circuit topology, a string of n duty cycle correction elements has a correction value that may be represented, based on equations (9) and (10) above, as:

$$\text{Correction} \sim C[R_{lin1} + R_{lin2} + \ldots R_{linn}] \quad (11)$$

$$\text{Correction} \sim C[R_{lin1}' + R_{lin2}' + \ldots R_{linn}'] \quad (12)$$

From equations 11 and 12 above, it can be seen that the corrections are determined by the effective output node Out' capacitance and the resistance values of the linear resistors. Since the node capacitance and the resistance values of the linear resistors are independent of the operating voltage, the duty cycle correction will also be, to first order, independent of operating voltage. Furthermore, the linear resistors can be made to have very tightly controlled manufacturing process compared to FETs and thus, are largely independent of the manufacturing process used to create the DCC circuit. Linear resistors are less sensitive to manufacturing process because the number of parameters that need to be controlled during the manufacturing process are significantly less than that of FETs. Parameters associated with doping, gate oxides, silicides, and the like, are not of a concern with regard to the manufacture of linear resistors. Thus, the resulting DCC circuit is well suited for providing non-50% duty cycle and varying duty cycles since it's correction values are relatively independent of the fluctuations in process and voltage.

Figure 6A:
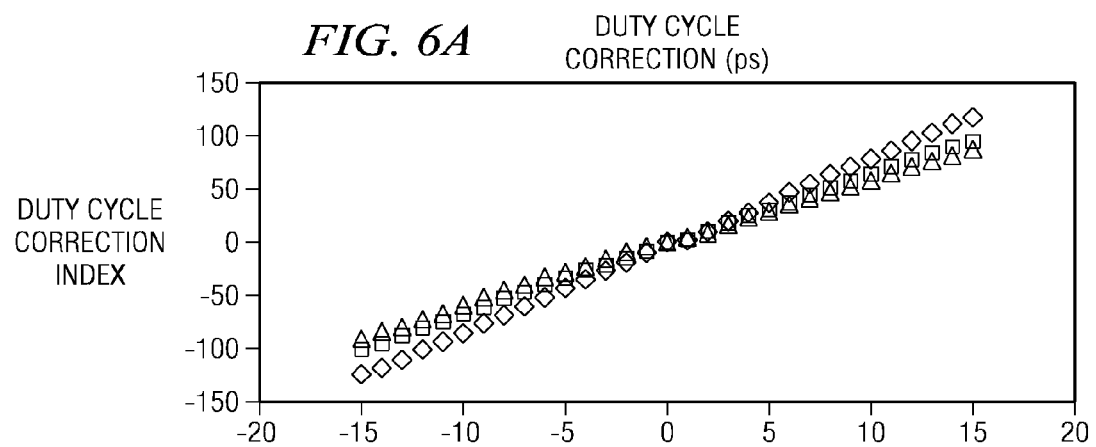
FIGS. 6A-6B are exemplary plots illustrating are exemplary plots illustrating variances in duty cycle correction range due to changes in operating voltage and process for a DCC circuit topology in accordance with one illustrative embodiments.
Figure 6B:
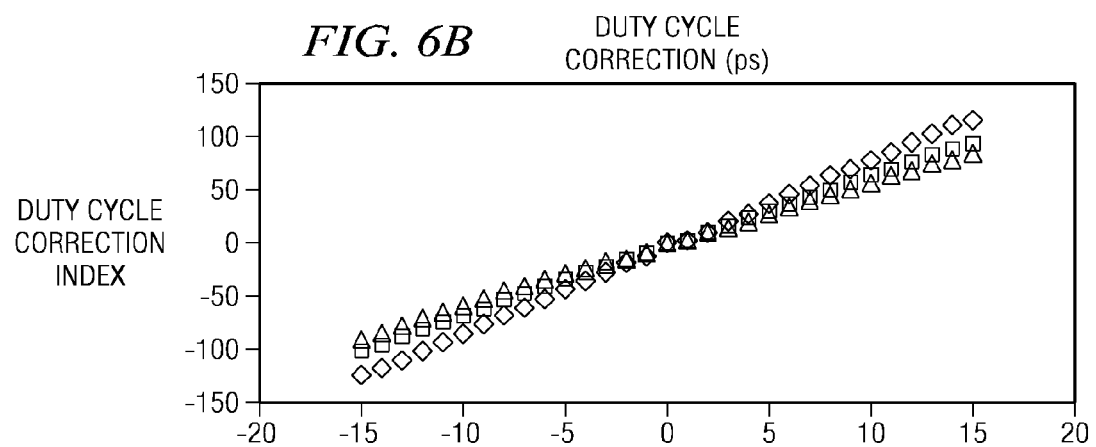

FIGS. 6A-6B are exemplary plots illustrating variances in duty cycle correction range due to changes in operating voltage and process for a DCC circuit topology in accordance with one illustrative embodiments. The plots shown in FIGS. 6A and 6B are for a DCC circuit having the topology of FIG. 5A in which polysilicon based linear resistors are used to provide the incremental duty cycle correction. As shown in FIGS. 6A and 6B, for an operating voltage between 0.8V and 1.2V there is approximately a 7% change in DCC correction range. For a process parameter (nrn) between the values of 0.03 (fastest manufacturing process) and 0.95 (slowest manufacturing process), there is approximately a 12% change in DCC correction range. These are significantly lower changes than the 40% and 85% experienced by the known FET based DCC circuit topology described previously.

Thus, the illustrative embodiments provide a DCC circuit that is relatively independent of manufacturing process and operating voltage. Because of this independence, the DCC circuit of the illustrative embodiments is especially well suited for use in applications where the required duty cycle of the input signal to the DCC circuit is either non-50% or is varying, such as an application in which the DCC circuit provides duty cycle correction to an input signal of a memory array in a data processing system.

Figure 7:
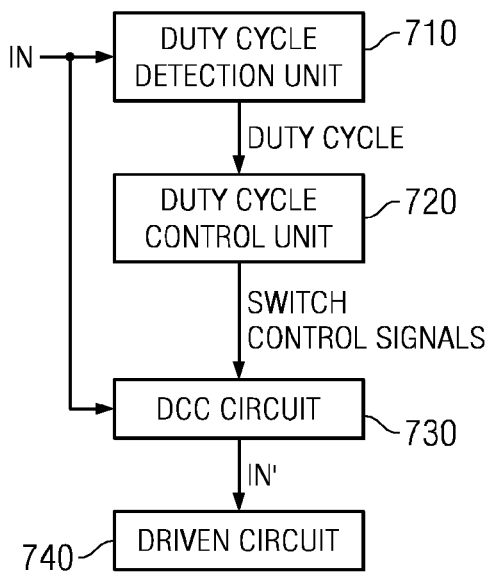
FIG. 7 is an exemplary block diagram of a duty cycle correction mechanism in accordance with one illustrative embodiment.

FIG. 7 is an exemplary block diagram of a duty cycle correction (DCC) mechanism in accordance with one illustrative embodiment. The DCC mechanism 700 in FIG. 7 may be provided as part of an integrated circuit device, for example, which in turn, may be part of a larger computing device. Many different applications of the DCC mechanism 700 are possible and thus, they all cannot be set forth herein. Suffice it to say that any application of the DCC mechanism, or the circuitry illustrated in FIGS. 4A and 5A above, is intended to be within the spirit and scope of the present invention.

As shown in FIG. 7, the DCC mechanism 700 includes a duty cycle detection unit 710, a duty cycle control unit 720, a duty cycle correction circuit 730, and a driven circuit 740, e.g., a memory array circuit or the like. The duty cycle detection unit 710 detects the duty cycle of the input signal IN in a manner generally known in the art. The duty cycle control unit 720 compares the detected duty cycle to a desired duty cycle, which may be a 50% duty cycle, a non-50% duty cycle, or even a varying duty cycle. Based on this comparison, the duty cycle control unit 720 calculates a desired amount of duty cycle correction.

The duty cycle control unit 720 then sends control signals to control the opening/closing of switches in the duty cycle correction circuit 730, which preferably has a topology similar to that of FIG. 4A or FIG. 5A. The control signals are generated based on the desired amount of duty cycle correction.

The duty cycle correction circuit 730 performs duty cycle correction on the input signal IN based on the opening/closing of switches controlled by the duty cycle control unit 720. The resulting DCC circuit 730 corrected input signal IN' is then output to the driven circuit 740 for use by the driven circuit 740. In one example, the input signal IN may be a clock signal whose duty cycle is corrected to generate a corrected clock signal IN' that is provided to the driven circuit 740 to thereby clock the driven circuit 740.

Figure 8:
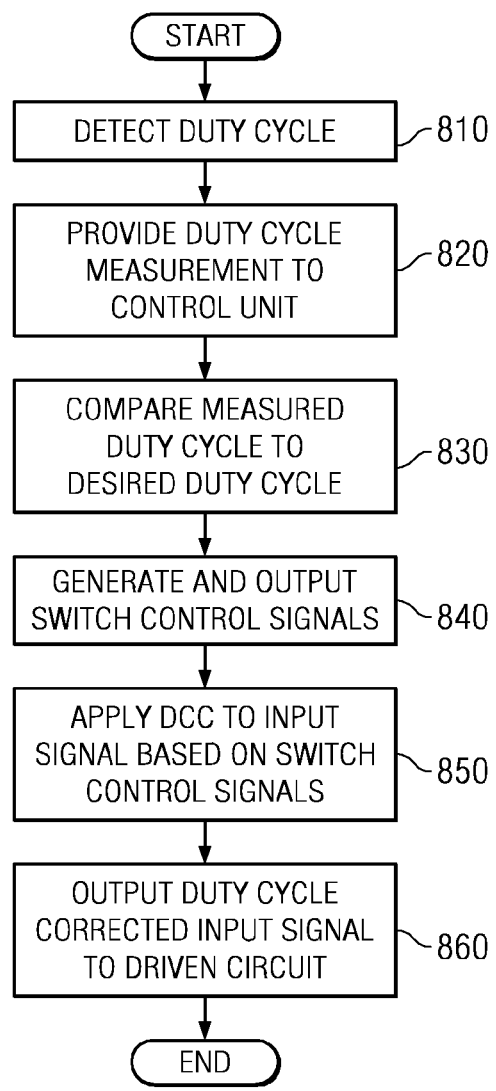
FIG. 8 is a flowchart outlining an exemplary operation of a duty cycle correction mechanism in accordance with one illustrative embodiment.

FIG. 8 is a flowchart outlining an exemplary operation of a duty cycle correction mechanism in accordance with one illustrative embodiment. The operation outlined in FIG. 8 is preferably performed by a DCC mechanism, such as the one depicted in FIG. 7, that utilizes a DCC circuit having a circuit topology that utilizes linear resistors to provide the duty cycle correction, such as described above with regard to FIGS. 4A and 5A.

As shown in FIG. 8, the operation starts with a duty cycle detection unit detecting a duty cycle of an input signal (step 810). The duty cycle detection unit provides the measurement of the duty cycle to a duty cycle control unit (step 820) which compares the measured duty cycle to a desired duty cycle (step 830). Based on the results of the comparison, the duty cycle control unit generates and outputs switch control signals to a duty cycle correction circuit (step 840). The duty cycle correction circuit applies the desired duty cycle correction to the input signal based on the received switch control signals (step 850) and outputs a duty cycle corrected input signal (step 860). The operation then terminates.

Thus, as stated above, the illustrative embodiments provide an improved duty cycle correction circuit that is less sensitive to process, voltage, and temperature (PVT) than known duty cycle correction circuits. In fact, the duty cycle correction circuit is virtually independent of process and operating voltage when compared to known duty cycle correction circuits. Because of this virtual independence, the duty cycle correction circuit is suitable to applications in which changes in duty cycle are desirable. Moreover, the duty cycle correction circuit of the illustrative embodiments may be used to provide non-50% duty cycles.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections).

In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 9:
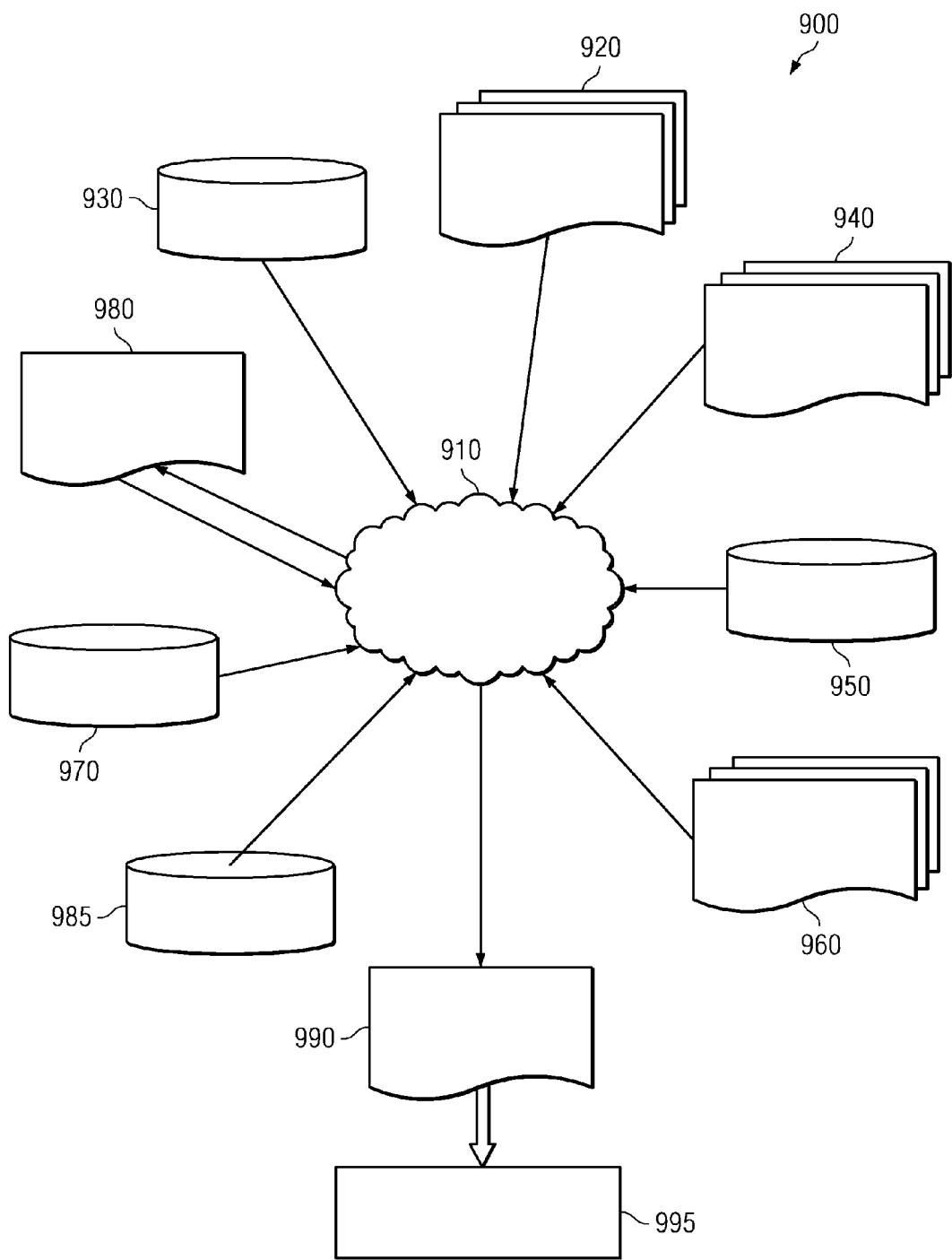
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 4A, 5A, and 7. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4A, 5A, and 7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4A, 5A, and 7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4A, 5A, and 7. In one embodiment, design structure 990 may comprise a compiled, executable HDL simulation model that functionally simulates the devices shown in FIGS. 4A, 5A, and 7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 4A, 5A, and 7. Design structure 990 may then proceed to a stage 995 where, for example, design structure 990 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A design structure encoded on a machine-readable data storage device, wherein the design structure is loaded from the machine-readable data storage device into a computer for generating a machine-executable representation of a duty cycle correction circuit, wherein said design structure comprises:

a pair of first elements processed to generate a functional computer-simulated representation of a first pair of field effect transistors (FETs) having a first P-type FET and a first N-type FET;

a pair of second elements processed to generate a functional computer-simulated representation of at least two linear resistors coupled to the first pair of FETs, wherein a first linear resistor is coupled to the first P-type FET and a second linear resistor is coupled to the first N-type FET;

a third element processed to generate a functional computer-simulated representation of a first switch coupled to the first linear resistor; and a fourth element processed to generate a functional computer-simulated representation of a second switch coupled to the second linear resistor, wherein the first, second, third, and fourth elements are configured such that an input signal is provided to the first pair of FETs and a corrected input signal is output by the at least two linear resistors, and wherein the first and second switches are selectively controlled so as to cause at least one of the first or second linear resistors to increase or decrease a duty cycle of the input signal.

2. The design structure of claim 1, wherein the design structure comprises a netlist.

3. The design structure of claim 1, wherein the design structure resides on the storage device as a data format used for the exchange of layout data of integrated circuits.

4. The design structure of claim 1, wherein the first switch is coupled to the first linear resistor in parallel, and the second switch is coupled to the second linear resistor in parallel in the machine-executable representation of the duty cycle correction circuit.

5. The design structure of claim 1, wherein the design structure is configured such that, in the machine-executable representation of the duty cycle correction circuit, a resistance value associated with the first linear resistor is less than approximately ten percent of a resistance value associated with the first P-type FET, and a resistance value associated with the second linear resistor is less than approximately ten percent of a resistance value associated with the first N-type FET.

6. The design structure of claim 1, further comprising:
a fifth element processed to generate a functional computer-simulated representation of a duty cycle detection unit coupled to an input signal line of the duty cycle correction circuit; and
a sixth element processed to generate a functional computer-simulated representation of a duty cycle control unit coupled to the duty cycle detection unit and the first and second switches, wherein the design structure is configured such that duty cycle detection unit provides a measure of a duty cycle of the input signal to the duty cycle control unit, and the duty cycle control unit controls opening and closing of the first and second switches so as to provide an appropriate amount of duty cycle correction, based on the measure of the duty cycle of the input signal provided by the duty cycle detection unit and a desired duty cycle for the input signal.

7. The design structure of claim 1, wherein the design structure is configured such that, in the machine-executable representation of the duty cycle correction circuit, the first linear resistor operates on a signal output by the first P-type FET to thereby pull-up a pulse width of the signal output by the first P-type FET and thereby decrease a duty cycle of the signal output by the P-type FET.

8. The design structure of claim 1, wherein the design structure is configured such that, in the machine-executable representation of the duty cycle correction circuit, the second linear resistor operates on a signal output by the first N-type FET to thereby pull-down a pulse width of the signal output by the first P-type FET and thereby increase a duty cycle of the signal output by the N-type FET.

9. The design structure of claim 1, wherein the design structure is configured such that, in the machine-executable representation of the duty cycle correction circuit, if no duty cycle correction is required, both the first switch and the second switch are closed.

10. The design structure of claim 1, wherein the design structure is configured such that, in the machine-executable representation of the duty cycle correction circuit, if a duty cycle of the input signal is to be decreased, the first switch is opened and the second switch is closed, such that the input signal passes through the first linear resistor.

11. The design structure of claim 1, wherein the design structure is configured such that, in the machine-executable representation of the duty cycle correction circuit, if a duty cycle of the input signal is to be increased, the first switch is closed and the second switch is opened, such that the input signal passes through the second linear resistor.

12. The design structure of claim 1, further comprising:
fifth elements processed to generate a functional computer-simulated representation of a second pair of FETs coupled to the first and second linear resistors, wherein the design structure is configured such that the second pair of FETs comprise a second P-type FET and a second N-type FET, and the second pair of FETs operate as buffers between successive duty cycle correction stages.

13. The design structure of claim 1, further comprising:
one or more fifth elements processed to generate a functional computer-simulated representation of one or more additional first linear resistors coupled in series with the first linear resistor;
one or more sixth elements processed to generate a functional computer-simulated representation of one or more additional second linear resistors coupled in series with the second linear resistor; and
one or more seventh elements processed to generate a functional computer-simulated representation of one or more additional switches coupled to the one or more additional first and second linear resistors.

14. The design structure of claim 13, further comprising:
an eighth element processed to generate a functional computer-simulated representation of a duty cycle detection unit coupled to an input signal line of the duty cycle correction apparatus; and
a ninth element processed to generate a functional computer-simulated representation of a duty cycle control unit coupled to the duty cycle detection unit, the first and second switches, and the one or more additional switches, wherein the design structure is configured such that, in the machine-executable representation of the duty cycle correction circuit, the duty cycle detection unit provides a measure of a duty cycle of the input signal to the duty cycle control unit, and the duty cycle control unit controls opening and closing of the first, second, and one or more additional switches, so as to provide an appropriate amount of duty cycle correction, based on the measure of the duty cycle of the input signal provided by the duty cycle detection unit and a desired duty cycle for the input signal.

15. A hardware description language (HDL) design structure encoded on a machine-readable data storage device, wherein the HDL design structure is loaded from the machine-readable data storage device into a computer for generating a machine-executable representation of a duty cycle correction circuit, wherein said HDL design structure comprises:

a pair of first elements processed to generate a functional computer-simulated representation of a first pair of field effect transistors (FETs) having a first P-type FET and a first N-type FET;

a pair of second elements processed to generate a functional computer-simulated representation of at least two linear resistors coupled to the first pair of FETs, wherein a first linear resistor is coupled to the first P-type FET and a second linear resistor is coupled to the first N-type FET;

a third element processed to generate a functional computer-simulated representation of a first switch coupled to the first linear resistor; and a fourth element processed to generate a functional computer-simulated representation of a second switch coupled to the second linear resistor, wherein the first, second, third, and fourth elements are configured such that an input signal is provided to the first pair of FETs and a corrected input signal is output by the at least two linear resistors, and wherein the first and second switches are selectively controlled so as to cause at least one of the first or second linear resistors to increase or decrease a duty cycle of the input signal.

16. The design structure of claim 15, wherein the design structure comprises a netlist.

17. The design structure of claim 15, wherein the design structure resides on storage medium as a data format used for the exchange of layout data of integrated circuits.

18. A method in a computer-aided design system for generating a functional design model of a duty cycle correction circuit, said method comprising:

generating a functional computer-simulated representation of a first pair of field effect transistors (FETs) having a first P-type FET and a first N-type FET;

generating a functional computer-simulated representation of at least two linear resistors coupled to the first pair of FETs, wherein a first linear resistor is coupled to the first P-type FET and a second linear resistor is coupled to the first N-type FET;

generating a functional computer-simulated representation of a first switch coupled to the first linear resistor; and generating a functional computer simulated representation of a fourth element processed to generate a functional computer-simulated representation of a second switch coupled to the second linear resistor, wherein the functional computer-simulated representations are configured such that an input signal is provided to the first pair of FETs and a corrected input signal is output by the at least two linear resistors, and wherein the first and second switches are selectively controlled so as to cause at least one of the first or second linear resistors to increase or decrease a duty cycle of the input signal.

19. The method of claim 18, further comprising:

generating a functional computer-simulated representation of a duty cycle detection unit coupled to an input signal line of the duty cycle correction circuit; and generating a functional computer-simulated representation of a duty cycle control unit coupled to the duty cycle detection unit and the first and second switches, wherein the duty cycle detection unit provides a measure of a duty cycle of the input signal to the duty cycle control unit, and the duty cycle control unit controls opening and closing of the first and second switches so as to provide an appropriate amount of duty cycle correction, based on the measure of the duty cycle of the input signal provided by the duty cycle detection unit and a desired duty cycle for the input signal.

20. The method of claim 18, further comprising:

generating a functional computer-simulated representation of one or more additional first linear resistors coupled in series with the first linear resistor;

generating a functional computer-simulated representation of one or more additional second linear resistors coupled in series with the second linear resistor; and generating a functional computer-simulated representation of one or more additional switches coupled to the one or more additional first and second linear resistors.

\* \* \* \* \*